United States Patent
Yoshinaka (10) Patent No.: US 10,126,862 B2
(45) Date of Patent: Nov. 13, 2018

(54) OPERATION DEVICE

(71) Applicant: DENSO CORPORATION, Kariya, Aichi-pref. (JP)

(72) Inventor: Shinichi Yoshinaka, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 28 days.

(21) Appl. No.: 15/307,446

(22) PCT Filed: Apr. 13, 2015

(86) PCT No.: PCT/JP2015/002056
§ 371 (c)(1),
(2) Date: Oct. 28, 2016

(87) PCT Pub. No.: WO2015/170448
PCT Pub. Date: Nov. 12, 2015

(65) Prior Publication Data
US 2017/0052636 A1    Feb. 23, 2017

(30) Foreign Application Priority Data
May 9, 2014    (JP) .................. 2014-097930

(51) Int. Cl.
*G06F 3/041* (2006.01)
*H01H 36/00* (2006.01)
(Continued)

(52) U.S. Cl.
CPC .......... *G06F 3/0416* (2013.01); *G06F 3/0362* (2013.01); *G06F 3/044* (2013.01);
(Continued)

(58) Field of Classification Search
CPC ...... G06F 3/0416; G06F 3/0362; G06F 3/044; H01H 36/00; H01H 89/00; H03K 17/9622; H03K 2217/960705
See application file for complete search history.

(56) References Cited

U.S. PATENT DOCUMENTS

2007/0285071 A1* 12/2007 Su ........................... G05F 1/575
                                                                323/282
2010/0153876 A1*  6/2010 Kim ...................... G06F 3/0482
                                                                715/800
(Continued)

FOREIGN PATENT DOCUMENTS

JP    2007028512 A    2/2007
JP    2010021118 A    1/2010
(Continued)

*Primary Examiner* — Sejoon Ahn
(74) *Attorney, Agent, or Firm* — Harness, Dickey & Pierce, P.L.C.

(57) ABSTRACT

An operation device includes an operation plate, an electrode, a determination portion, an output portion, a dial, a dummy electrode, a for-dummy determination portion, and a disablement portion. The operation plate includes an operation surface that is contact-operated by an operator's fingertip. The determination portion determines whether the contact-operation is performed based on an amount of capacitance change between the fingertip and the electrode. The output portion outputs a predetermined command signal on the condition that the contact-operation is determined to be performed. When it is determined by the dummy electrode and the for-dummy determination portion that an operator's hand is placed at a position where a dial is operable, the disablement portion prohibits an output of the command signal or disables the outputted command signal.

4 Claims, 5 Drawing Sheets (51) Int. Cl.
*H01H 89/00* (2006.01)
*G06F 3/0362* (2013.01)
*G06F 3/044* (2006.01)
*H03K 17/96* (2006.01)

(52) U.S. Cl.
CPC ............ *H01H 36/00* (2013.01); *H01H 89/00* (2013.01); *H03K 17/9622* (2013.01); *H03K 2217/960705* (2013.01)

(56) References Cited

U.S. PATENT DOCUMENTS

| | | | |
|---|---|---|---|
| 2010/0169834 A1* | 7/2010 | Wakizaka | G06F 3/04817 715/821 |
| 2010/0230181 A1* | 9/2010 | Suzuki | G06F 3/044 178/18.06 |
| 2012/0037485 A1* | 2/2012 | Sitarski | H03K 17/955 200/600 |
| 2016/0224133 A1* | 8/2016 | Perret-Gentil | G06F 3/03543 |
| 2016/0328068 A1* | 11/2016 | Ba-Tis | G06F 3/0414 |

FOREIGN PATENT DOCUMENTS

| | | |
|---|---|---|
| JP | 2011058696 A | 3/2011 |
| JP | 2013256186 A | 12/2013 |
| JP | 2014075069 A | 4/2014 |
| WO | WO-2015075874 A1 | 5/2015 |

\* cited by examiner

OPERATION DEVICE

CROSS REFERENCE TO RELATED APPLICATIONS

This application is a U.S. National Phase Application under 35 U.S.C. 371 of International Application No. PCT/JP2015/002056 filed on Apr. 13, 2015 and published in Japanese as WO 2015/170448 A1 on Nov. 12, 2015. This application is based on and claims the benefit of priority from Japanese Patent Application No. 2014-097930 filed on May 9, 2014. The entire disclosures of all of the above applications are incorporated herein by reference.

TECHNICAL FIELD

The present disclosure relates to an operation device.

BACKGROUND ART

In an operation device of a capacitance type, when an operation surface is operationally touched with a fingertip, a capacitance is changed and whereby the contact operation is detected with. Hence, the comfortable operability of merely lightly touching the operation surface with the fingertip is obtained. However, as a trade-off with the comfortable operability, even if a part of the hand unintentionally contacts the operation surface, the contact operation is detected. For example, as disclosed in Patent Document 1, when a dial (manual operation portion) is disposed in the vicinity of the operation surface, a part of the hand rotationally operating the dial may touch the operation surface, and the contact operation may be detected unintentionally.

To cope with the above problem, in Patent Document 1, when a signal output from the dial is changing, the contact operation on the operation surface is disabled with assuming that an operator's intention is to operate the dial but not to execute the contact operation. Accordingly, even if the operation surface is touched with the hand during the dial operation, various devices can be prevented from being operated on the basis of the contact operation.

However, in the above Patent Document 1, the contact operation is disabled during the output signal from the dial changing, and the contact operation is not disabled by causing the operator to merely pick the dial, and begins to be disabled by the rotational operation. For that reason, there is a risk that the contact operation is detected at the time when the dial is picked for its rotational operation, and the above problem cannot be sufficiently solved.

PRIOR ART DOCUMENT

Patent Document

Patent Document 1: JP 2013-256186 A

SUMMARY

The present disclosure has been made in view of the above difficulties, and an object of the present disclosure is to provide an operation device that improves certainty of disablement of contact-operation on an operation surface when a part of a hand is to manually operate a manual operation portion and erroneously touches the operation surface.

According to an aspect of the present disclosure, an operation device includes an operation plate having an operation surface, a first electrode that is disposed at a position facing the operation surface, a first determination portion that determines whether a hand of an operator touches the operation surface based on an amount of capacitance change between the hand of the operator and the first electrode, an output portion that outputs a predetermined command signal when the first determination portion determines that the hand of the operator touches the operation surface, a manual operation portion that is disposed on the operation plate and operated by the operator mechanically and manually, a detection portion that detects that the hand of the operator is placed at a manually operable position where the manual operation portion is manually operable, and a disablement portion that prohibits the output of the predetermined command signal from the output portion or disables the outputted predetermined command signal when the detection portion detects that the operator's hand is placed at the manually operable position.

According to the present disclosure, contact-operation on the operation surface is disabled by merely placing the operator's hand at a position where the manual operation portion is operable, regardless of whether the manual operation is actually performed. Hence, certainty of disablement of the contact-operation in a case where a part of the hand is to operate the manual operation portion and erroneously touches the operation surface can be improved.

DESCRIPTION OF EMBODIMENTS

Hereinafter, multiple embodiments for implementing the present invention will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

Figure 1:
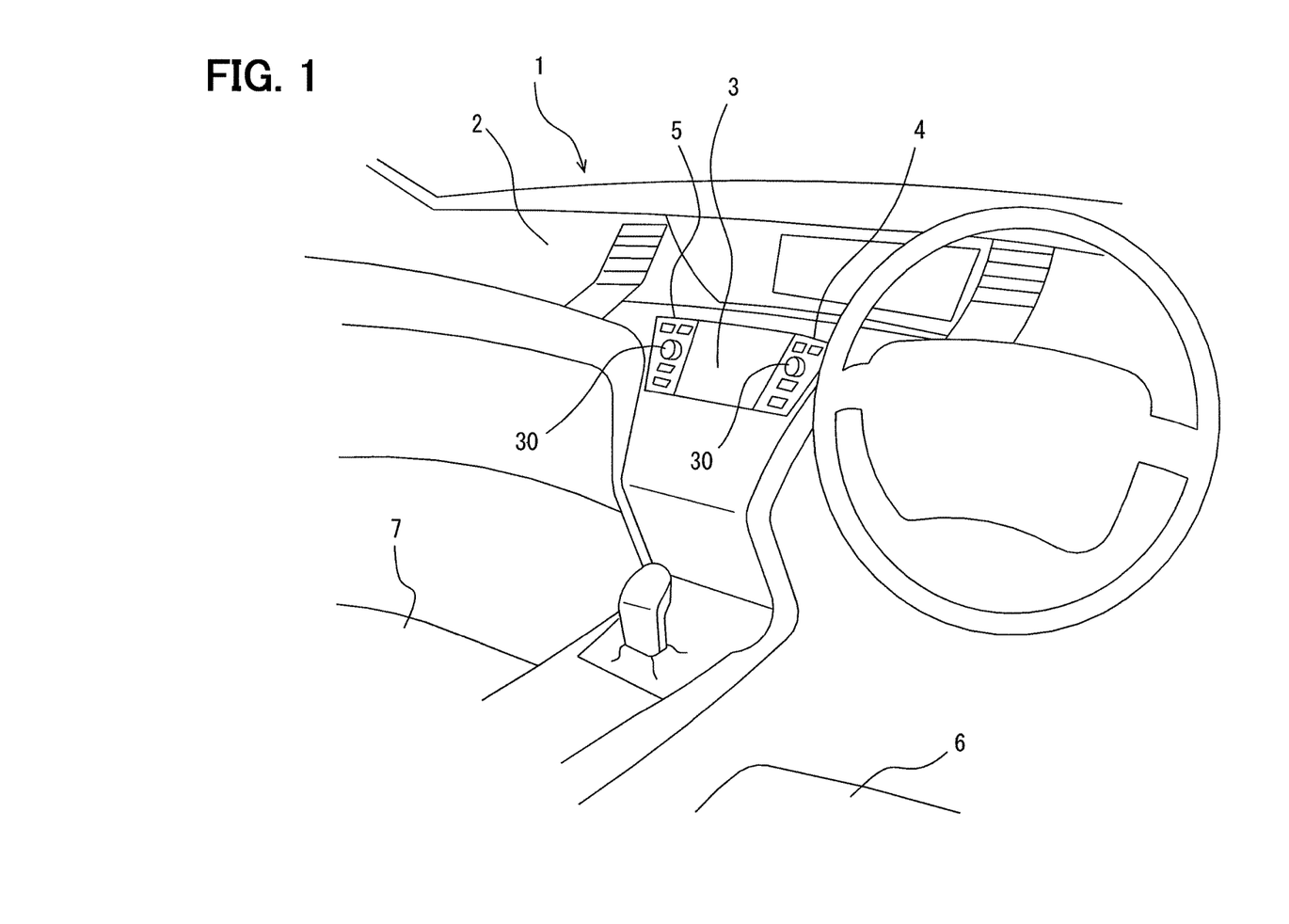
FIG. 1 is a perspective view illustrating a state of an operation device mounted in a vehicle according to a first embodiment of the present disclosure.

FIG. 1 is a perspective view illustrating an instrument panel (instrument panel 2) mounted in a vehicle 1 viewed from a vehicle interior side. A display device 3 and operation devices 4, 5 are assembled in a center portion of the instrument panel 2 in a horizontal direction of the vehicle.

In the present embodiment, an object to be operated by the operation devices 4 and 5 is an air conditioner 60 (refer to FIG. 2) that conditions an air in the vehicle interior. More specifically, an air volume setting, a temperature setting, the operation of automatic control, and a stop of the air conditioner 60 are operated by the operation devices 4 and 5. The operation device 4 near to a driver's seat 6 and the operation device 5 near to a passenger's seat 7 are different in a symmetrical shape from each other, but substantially identical in configuration with each other. Therefore, in the following description, the operation device 5 near to the passenger's seat 7 will be mainly described.

Figure 2:
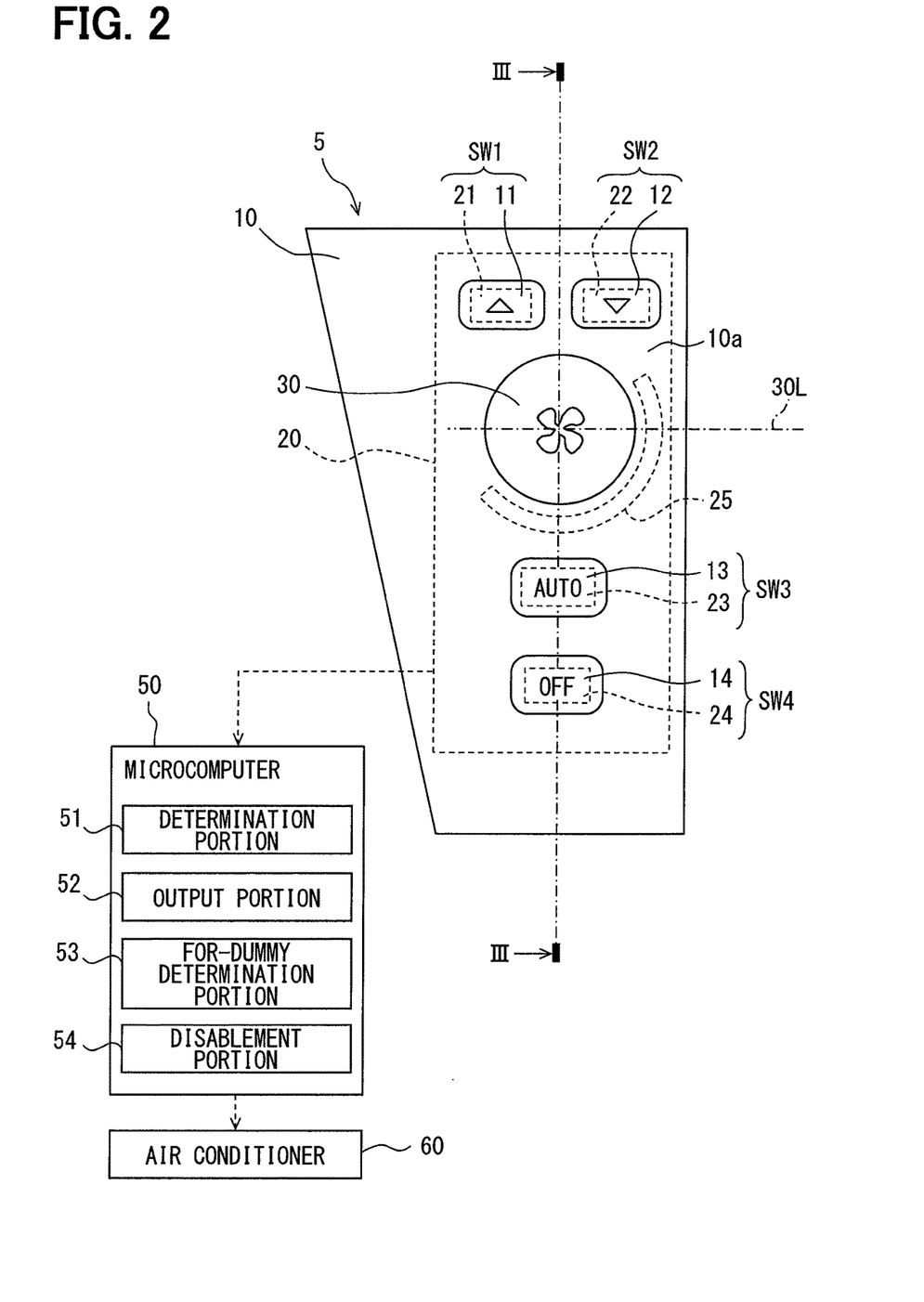
FIG. 2 is a schematic front view of the operation device according to the first embodiment.
Figure 3:
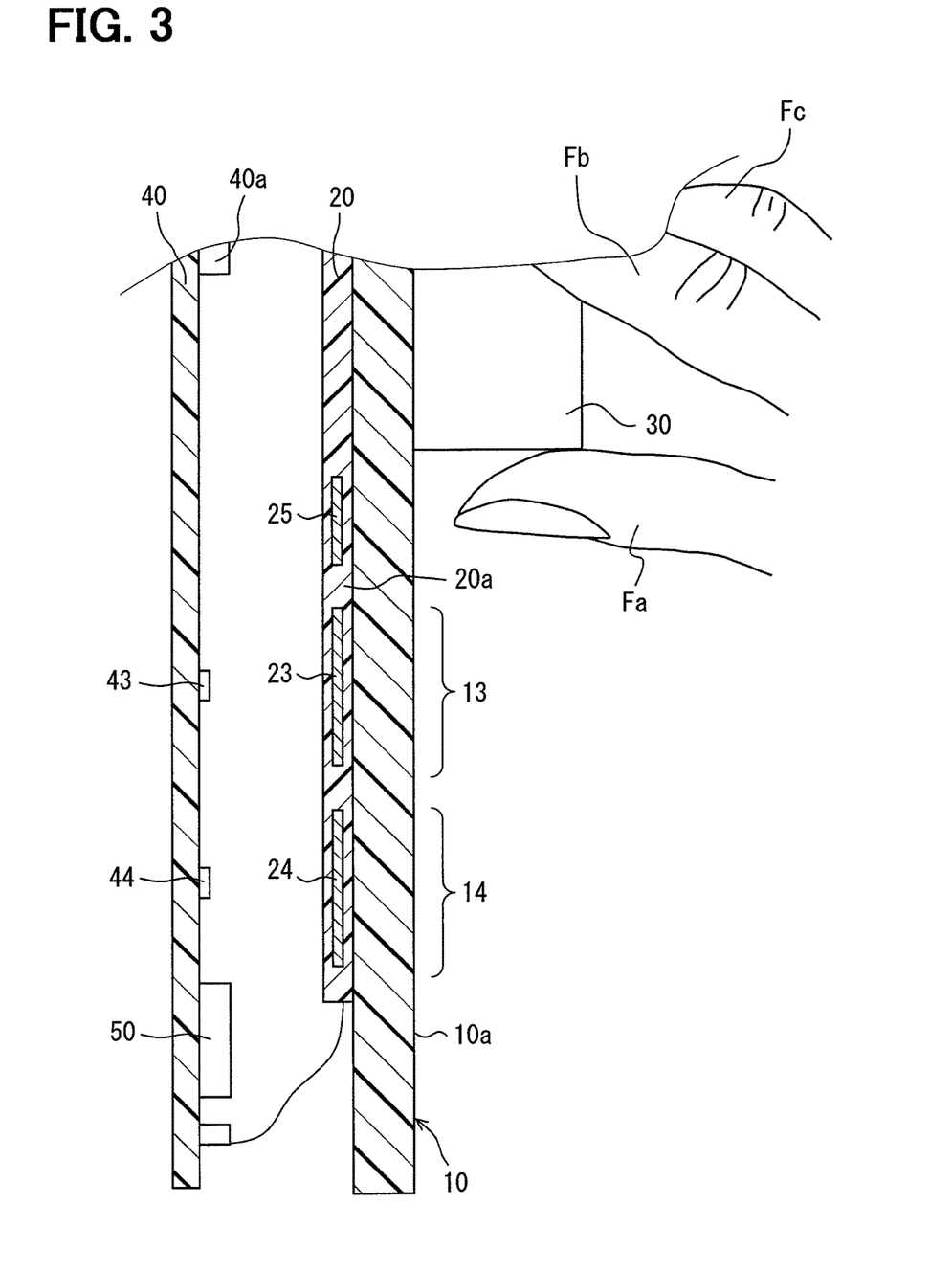
FIG. 3 is a schematic cross-sectional view taken along a line III-III of FIG. 2.

As illustrated in FIGS. 2 and 3, the operation device 5 includes an operation plate 10, an electrode sheet 20, a dial 30, and a printed circuit board 40 which will be described below. The operation plate 10 is formed of a plate member made of resin, and has a decorative surface 10a visually recognized by the operator. The decorative surface 10a has multiple operation surfaces 11, 12, 13, and 14. Characters, symbols, or figures indicative of setting contents of the object to be operated are printed on those operation surfaces 11, 12, 13, and 14.

The electrode sheet 20 is stuck onto an opposite side of the decorative surface 10a in the operation plate 10. The electrode sheet 20 includes multiple electrodes 21, 22, 23, and 24 (first electrodes) and a dummy electrode 25 (second electrode) to be described later. Those electrodes 21, 22, 23, 24, and the dummy electrode 25 are held on an insulating sheet 20a made of resin. Each of the electrodes 21 to 24 is disposed to face a corresponding one of the operation surfaces 11 to 14 across the operation plate 10 and the insulating sheet 20a.

The dial 30 rotationally operated by the operator (vehicle occupant) is put on the operation plate 10. The operation surfaces 11 to 14 are contact operated with the operator whereas the dial 30 (manual operation portion) is mechanically and manually manipulated by the operator. The dial 30 that is a rotatable body is configured to be rotationally operated while being picked by a thumb Fa and the other fingers of the operator. In an example of FIG. 3, the dial 30 is picked between an index finger Fb and a middle finger Fc, and the thumb Fa. The dial 30 is columnar or cylindrical, and a rotational center line of the dial 30 is perpendicular to the decorative surface 10a.

The printed circuit board 40 is disposed on an opposite side of the operation plate 10 with respect to the electrode sheet 20. A rotation sensor 40a that detects a rotational operation amount and an operation direction of the dial 30, and multiple light sources 43, 44 are implemented on the printed circuit board 40. The multiple light sources 43 and 44 are disposed to face the respective electrodes 21 to 24. Transparent electrodes made of indium tin oxide is employed for the electrodes 21 to 24. In addition, the operation plate 10 is formed of a resin member having a light transmissive property. Unprinted portions of the operation surfaces 11 to 14 are transmissively illuminated by the light sources 43 and 44. Incidentally, a paint having a light-shielding property is printed on a portion of the decorative surface 10a except for the operation surfaces 11 to 14.

Each of the electrodes 21 to 24 outputs a voltage change caused according to a change in the capacitance as an electric signal. The electric signal (electrode signal) output from each of the electrodes 21 to 24 is input to a microcomputer 50 mounted on the printed circuit board 40. The microcomputer 50 includes a storage device that stores a program, and a central processing unit that executes arithmetic processing according to the stored program. The microcomputer 50 functions as a determination portion 51 (first determination portion), an output portion 52, a for-dummy determination portion 53 (second determination portion), and a disablement portion 54, which will be described below, with the execution of various arithmetic processing (refer to FIG. 2).

Figure 4:
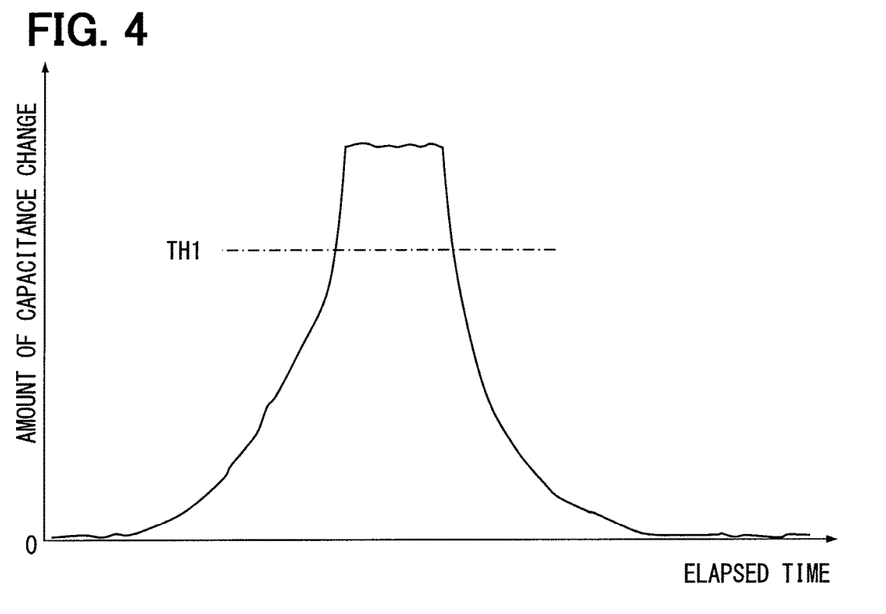
FIG. 4 is a diagram illustrating a change in capacitance when an operation surface of the operation device according to the first embodiment is contact operated.

The determination portion 51 determines whether the operation surfaces 11 to 14 are touched with the operator's hand, or not, on the basis of an amount of capacitance change (electrostatic detection value) caused between the operator's hand (for example, fingertip) and the electrodes 21, 24, that is, whether the operation surfaces 11 to 14 are subjected to the contact operation, or not. FIG. 4 illustrates an example of the change in the electrostatic detection value caused by the contact operation. In this case, the electrostatic detection value rises more as the fingertip comes closer to the operation surface 11, and becomes a maximum value at a time when the operation surface 11 is touched with the fingertip. Thereafter, the electrostatic detection value falls more as the fingertip moves away from the operation surface 11 more. A preset first threshold TH1 is stored in the microcomputer 50. The determination portion 51 determines whether the electrostatic detection value becomes larger than the first threshold TH1, or not. When the electrode signal that exceeds the first threshold TH1 is output from the electrode 21 of the electrodes 21 to 24, the determination portion 51 determines that the corresponding operation surface 11 is subjected to the contact operation. Further, the determination portion 51 determines that the contact operation is performed on the condition that a state in which the electrostatic detection value exceeds the first threshold TH1 is continued for a predetermined time or longer.

Incidentally, in the following description, the operation surfaces 11 to 14 and the electrodes 21 to 24 corresponding to the respective operation surfaces 11 to 14 are collectively called a first electrostatic switch SW1, a second electrostatic switch SW2, a third electrostatic switch SW3, and a fourth electrostatic switch SW4, respectively. All of the first thresholds TH1 set for the respective electrostatic switches SW1 to SW4 are set to the same value. In other words, all of the electrostatic switches SW1 to SW4 are set to be subjected to the contact operation with the same sensitivity.

The output portion 52 outputs a predetermined command signal to the air conditioner 60 on the condition that it is determined by the determination portion 51 that the contact operation is performed. An electric signal (dial signal) output from the rotation sensor 40a with the rotating operation of the dial 30 is always output to the air conditioner 60 from the microcomputer 50 aside from the electrode signal.

Meanwhile, generally, if the operation surfaces 11 to 14 are subjected to the contact operation, the electrostatic detection value is changed as illustrated in FIG. 4. However, when the dial 30 is rotationally operated, any finger (for example, thumb Fa) that picks the dial 30 may come closer to or touch the operation surface 13 as illustrated in FIG. 3. In that case, the electrostatic detection value detected by the electrode 24 corresponding to the operation surface 13 may rise to the enough degree to exceed the first threshold TH1 as illustrated in a dotted line in FIG. 5. This leads to a concern that it is determined by the determination portion 51 that the contact operation is performed, and there is a concern that the air conditioner 60 is operated with the contents against the operator's intention.

Against the above concern, the present embodiment includes a detection portion and the disablement portion 54

(refer to FIG. 2) which will be described below. The detection portion detects that the operator's hand is placed at a position (manually operable position) where the dial 30 is manually operable. More specifically, the detection portion detects that the operator's hand is placed at the position where the dial 30 can be rotationally operated, that is, the operator's hand is in a rotating operation state. That the operator's hand is placed at the manually operable position may mean that the operator's hand is placed at the position where the hand touches the dial 30. The dial 30 may be protruded from the operation plate 10, and that the operator's hand is placed at the manually operable position may mean that the operator's hand is placed at a position where the hand touches a side surface of the dial 30. As an example of the detection portion, the dummy electrode 25 and the for-dummy determination portion 53 illustrated in FIG. 2 are employed.

The dummy electrode 25 is held by the insulating sheet 20a in the same manner as that of the electrodes 21 to 24. The dummy electrode 25 is disposed at a position facing the operator's hand which is in the rotating operation state. In other words, the dummy electrode 25 is disposed at the manually operable position where the manual operation of the dial 30 is enabled. When viewed from a rotation axis direction of the dial 30, the dummy electrode 25 is disposed at a position facing at least a part of an outer peripheral surface of the dial 30. The dummy electrode 25 is disposed in an area close to the outer peripheral surface of at least a lower half of the dial 30, that is, an area of at least a lower area of a horizontal line 30L (refer to FIG. 2) passing through a center of the dial 30.

Figure 5:
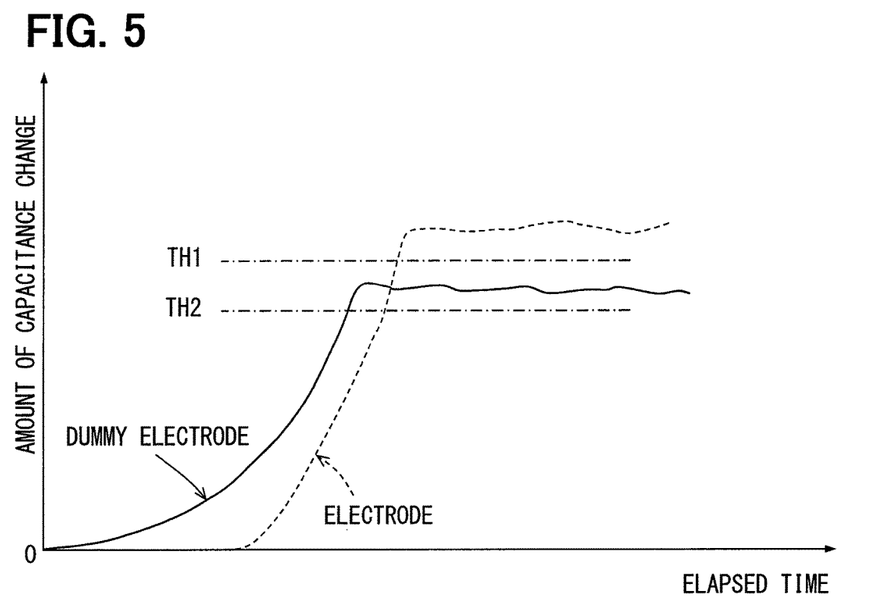
FIG. 5 is a diagram illustrating a change in the capacitance when rotationally operating a dial of the operation device according to the first embodiment.

The for-dummy determination portion 53 determines whether the operator's fingertip is in the rotating operation state described above, or not, on the basis of an amount of capacitance change (electrostatic detection value) caused between the operator's fingertip and the dummy electrode 25. FIG. 5 illustrates an example of a change in the electrostatic detection value cause by the electrode 23 and the dummy electrode 25 when the thumb Fa comes closer to the dummy electrode 25 and the electrode 23 with the rotating operation of the dial 30.

As indicated by a solid-line in FIG. 5, the electrostatic detection value caused by the dummy electrode 25 rises more as the thumb Fa comes closer to the position to pick the dial 30, and becomes a maximum value at the time when the thumb Fa picks the dial 30. Thereafter, a distance between the dummy electrode 25 and the thumb Fa pulses with the rotating operation of the dial 30, as a result of which the electrostatic detection value also pulses. A preset second threshold TH2 is stored in the microcomputer 50. The for-dummy determination portion 53 determines whether the electrostatic detection value becomes larger than the second threshold TH2, or not. When the electrode signal exceeding the second threshold TH2 is output from the dummy electrode 25, it is determined that the finger is in the rotating operation state where the dial 30 is picked between the fingers. Further, the for-dummy determination portion 53 determines that the contact operation is performed on the condition that a state in which the electrostatic detection value exceeds the second threshold TH2 is continued for a predetermined time or longer.

In an example of FIG. 5, the electrostatic detection value exceeds the second threshold TH2, and it is determined that the hand is in the rotating operation state at the time when picking the dial 30. In addition, because the pulsing electrostatic detection value exceeds the second threshold TH2 during the rotating operation, it is determined that the hand is in the rotating operation state. The second threshold TH2 is set to a value smaller than the first threshold TH1.

As indicated by a dotted line in FIG. 5, the electrostatic detection value caused by the electrode 23 rises more as the thumb Fa comes closer to the position to pick the dial 30. A part of the hand that rotationally operates may touch the operation surface 13 against the operator's intention, and, for example, the thumb Fa that picks the dial 30 may come closer to the operation surface 13. In that case, the electrostatic detection value in the third electrostatic switch SW3 exceeds the first threshold TH1, and the determination portion 51 may erroneously detect that the contact operation is performed.

In order to prevent the erroneous detection, in the present embodiment, the microcomputer 50 functions as the disablement portion 54. When it is determined by the for-dummy determination portion 53 that the hand is in the rotating operation state, the disablement portion 54 prohibits a command signal from being output from the output portion 52 to the air conditioner 60. In the present embodiment, all of the electrostatic switches SW1 to SW4 are set so as to be disabled by the disablement portion 54.

With the above configuration, according to the present embodiment, when it is determined that the operator's hand is in the rotating operation state, the output of the command signal to the air conditioner 60 is prohibited. For that reason, even if the dial 30 does not actually rotate, the contact operation of the electrostatic switches SW1 to SW4 is disabled by merely picking the dial 30. Hence, the contact operation of the electrostatic switches SW1 to SW4 can be prevented from being detected at the time of picking the dial 30 that has not yet been rotationally operated.

Further, according to the present embodiment, the respective electrodes 21 to 24 of the electrostatic switches SW1 to SW4 and the dummy electrode 25 are supported by the same insulating sheet 20a. For that reason, since an insulating sheet dedicated for the dummy electrode 25 can be made unnecessary, an increase in the number of components caused by the provision of the detection portion can be suppressed.

In this example, in the case of the electrostatic switches SW1 to SW4, the detection of the touch on the operation surfaces 11 to 14 is required. On the contrary, in the case of the dummy electrode 25, since the hand that picks the dial 30 does not always touch the decorative surface 10a, even if the hand does not touch the decorative surface 10a, the detection is required. In the present embodiment focusing on this fact, the second threshold TH2 used for the determination of the rotating operation state is set to a value smaller than the first threshold TH1 used for the determination of the contact operation of the electrostatic switches SW1 to SW4. For that reason, since the detection of the rotating operation state is higher in sensitivity than the detection of the contact operation, a risk that the detection of the rotating operation state is overlooked can be reduced.

In this case, when the operator who seats on the driver's seat 6 or the passenger's seat 7 picks the dial 30, a probability that the thumb Fa is placed in a lower-half area around the dial 30 is high. In the present embodiment focusing on this fact, the dummy electrode 25 is disposed in the lower-half area. Hence, the risk that the detection of the rotating operation state is overlooked can be reduced.

Further, according to the present embodiment, the dummy electrode 25 is shaped to extend along the circumference of the dial 30, and shaped to extend with a uniform width. For that reason, the sensitivity for detecting the rotating operation state can be restrained from becoming uneven depending on a portion of the dummy electrode 25.

Second Embodiment

In the above first embodiment, the manual operation portion that is mechanically and manually operated by the operator represents the dial 30 rotationally operated. On the contrary, in the present embodiment illustrated in FIG. 6, as an example of the manual operation portion mechanically and manually operated by the operator, a push-button switch 130 and an insertion port 110*b* which will be described in detail below are used.

Figure 6:
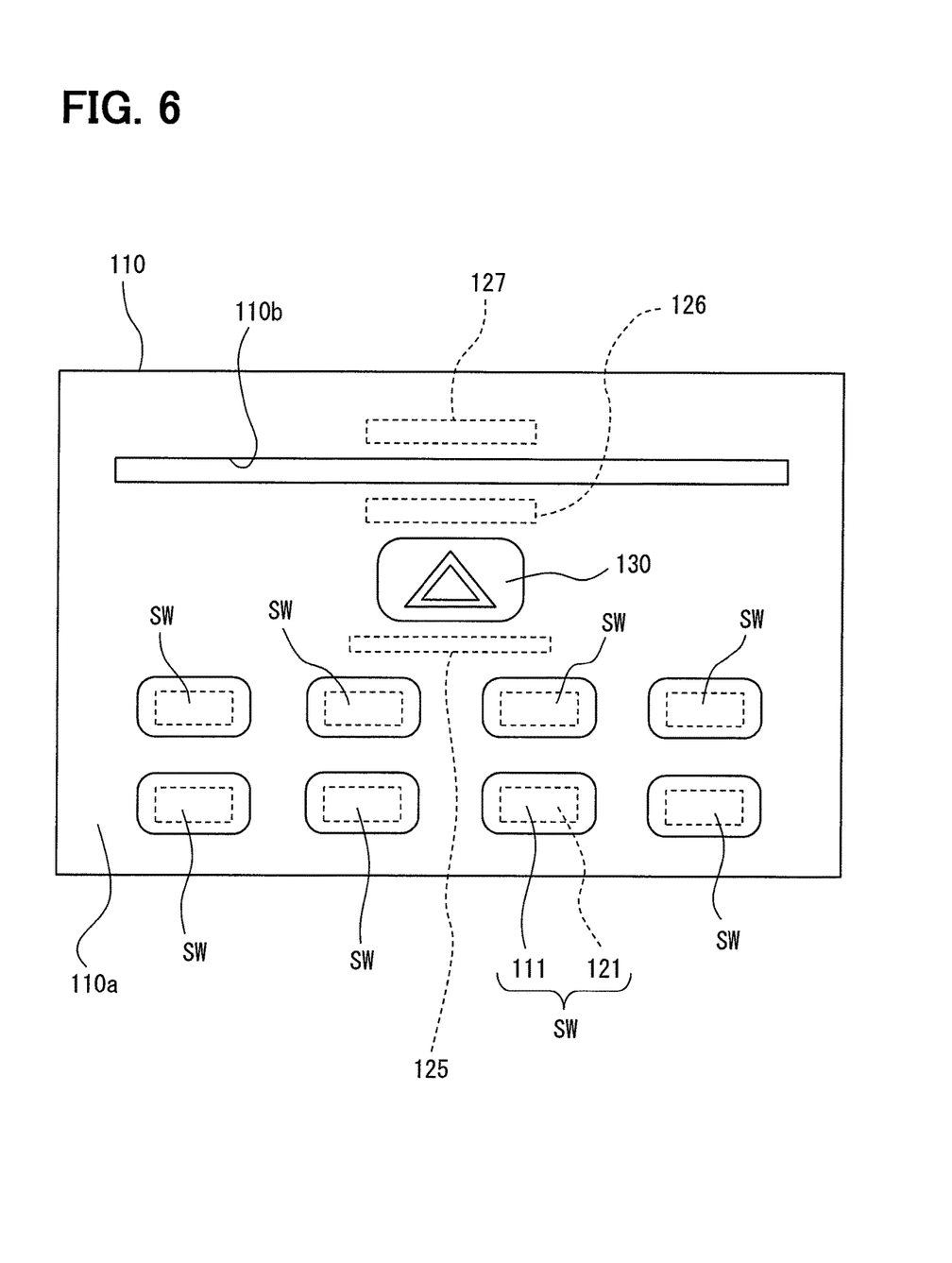
FIG. 6 is a front view of an operation device according to a second embodiment of the present disclosure.

An operation plate 110 provided in the operation device illustrated in FIG. 6 includes a decorative surface 110*a* visually recognized by the operator, and the decorative surface 110*a* includes multiple operation surfaces 111 as in FIG. 2. The same electrode sheet (not illustrated) as that in FIG. 3 is disposed on a rear side of the operation plate 110, and the electrode sheet includes multiple electrodes 121. In FIG. 6, each symbol SW collectively expresses one operation surface 111 and an electrode 121 corresponding to the operation surface 111.

An electrostatic switch area in which the multiple electrostatic switches SW are arranged is set in the decorative surface 110*a*. The push-button switch 130 is disposed on an upper portion of the electrostatic switch area in the decorative surface 110*a*. The push-button switch 130 is configured to command the flashing operation of a hazard flasher, which is an example of the manual operation portion mechanically and manually operated by the operator. The push-button switch 130 is configured so as to be pushed by the operator's finger. A direction of the pushing operation is perpendicular to the decorative surface 110*a*.

The insertion port 110*b* for inserting a disk as a storage medium is provided on an upper portion of the push-button switch 130 in the decorative surface 110*a*. As specific examples of information stored in the disk, there are map information used for a navigation device, music information used for an audio device, and so on.

The electrode sheet includes the multiple electrodes 121 (first electrodes) and dummy electrodes 125, 126, 127 (second electrodes) to be described below. The electrodes 121 and the dummy electrodes 125, 126, 127 are held on the same insulating sheet 20*a*. The detection portion according to the present embodiment detects that the operator's hand is placed at a position (manually operable position) where the push-button switch 130 or the insertion port 110*b* is manually operable. More specifically, the detection portion detects that the operator's hand is placed at the position where the push-button switch 130 can be pushed, that is, that the operator's hand is in a pushing operation state. Further, the detection portion detects that the operator's hand is placed at the position where the inserting operation into the insertion port 110*b* can be performed, that is, that the operator's hand is in an inserting operation state. That the operator's hand is placed at the manually operable position may mean that the operator's hand is placed at a position to touch the push-button switch 130 or the insertion port 110*b*. The detection portion is provided by the dummy electrodes 125, 126, 127 illustrated in FIG. 6 and a for-dummy determination portion to be described later.

The first dummy electrode 125 is disposed at a position facing the operator's hand that is in the pushing operation state. In other words, the dummy electrode 25 is disposed at the manually operable position where the manual operation of the push-button switch 130 is enabled. When viewed from a direction perpendicular to the decorative surface 110*a*, the first dummy electrode 125 is disposed at a position facing at least a part of the circumference of the push-button switch 130. More specifically, the first dummy electrode 125 is disposed in an area between the push-button switch 130 and the electrostatic switch area in the circumference of the push-button switch 130.

The second dummy electrode 126 and the third dummy electrode 127 are disposed at positions facing the operator's hand which is in the inserting operation state. In other words, the second dummy electrode 126 and the third dummy electrode 127 are disposed at the manually operable position where the manual operation of the insertion port 110*b* is enabled. When viewed from a direction perpendicular to the decorative surface 110*a*, the second dummy electrode 126 and the third dummy electrode 127 are disposed at positions facing at least parts of the circumference of the insertion port 110*b*. More specifically, the second dummy electrode 126 is disposed in an area between the insertion port 110*b* and the push-button switch 130 in the circumference of the insertion port 110*b*. More specifically, the third dummy electrode 127 is disposed on an upper portion of the insertion port 110*b* in the circumference of the insertion port 110*b*.

The for-dummy determination portion according to the present embodiment determines whether the operator's fingertip is in the pushing operation state described above, or not, on the basis of an amount of capacitance change (electrostatic detection value) caused between the operator's fingertip and the first dummy electrode 125. Further, the for-dummy determination portion determines whether the operator's fingertip is in the inserting operation state described above, or not, on the basis of an amount of capacitance change (electrostatic detection value) caused between the second dummy electrode 126 or the third dummy electrode 127 and the operator's fingertip.

When it is determined by the for-dummy determination portion that the operator's fingertip is in the pushing operation state or the inserting operation state, the disablement portion according to the present embodiment prohibits a command signal from being output from the output portion to an external device such as an air conditioner. In the present embodiment, all of the electrostatic switches SW are set so as to be disabled by the disablement portion.

With the above configuration, according to the present embodiment, when it is determined that the operator's fingertip is in the pushing operation state, an output of the command signal to the external device is prohibited. For that reason, even if the push-button switch 130 is not actually pushed and moved, the contact operation of the electrostatic switch SW is disabled by merely touching the push-button switch 130. Hence, the contact operation of the electrostatic switch SW can be prevented from being detected at the time of touching the push-button switch 130 that has not yet been pushed.

Further, according to the present embodiment, when it is determined that the operator's fingertip is in the inserting operation state, the output of the command signal to the external device is prohibited. For that reason, even if the disk is not actually inserted into the insertion port 110*b*, the contact operation of the electrostatic switch SW is disabled by merely bringing the hand having the disk closer to the insertion port 110*b*. Hence, the contact operation of the electrostatic switch SW can be prevented from being detected at the time of bringing the hand closer to the insertion port 110*b* before performing the inserting operation.

Hitherto, preferred embodiments of the present disclosure are described. However, the present disclosure is not limited to the above-described embodiments and may be variously changed and performed as exemplified below. In addition to combination of components for which enabling of specific combination are stated in each of the embodiments, the embodiments may be partially combined with each other even though no statement is present, particularly, as long as no problem in combination occurs.

In the above respective embodiments, the detection portion for detecting the rotating operation state, the pushing operation state, or the inserting operation state is realized with the detection in the change in the capacitance by the dummy electrode 25, 125, 126, or 127. On the contrary, various operating states may be detected by a photosensor (detection portion).

In the above respective embodiments, an object to be operated by the operation devices 4 and 5 represents the air conditioner 60. Alternatively, devices other than the air conditioner 60, for example, a navigation device, an audio device, and so on may be to be operated by the operation devices 4 and 5.

In the above respective embodiments, when the operating state is detected by the detection portion, all of the electrostatic switches SW1 to SW4 and SW are disabled. On the contrary, when the above operating state is detected, a part of the switches which are highly likely to be erroneously operated may be disabled. For example, in FIG. 2, when the operating state is detected, the electrostatic switches SW3 and SW4 located below the dial 30 are disabled, and the electrostatic switches SW1 and SW2 located above the dial 30 may be continued in an enable state.

In the respective embodiments, when the operating state is detected, the command signal is prohibited from being output to the external device by the contact operation of the electrostatic switch. On the contrary, the output of the command signal is permitted even when the operating state is detected, and in that case, the disablement portion 54 (microcomputer 50) may output a disable command signal to the external device. The disable command signal represents a signal for commanding the external device to disable the command signal. When the external device receives the disable command signal together with the command signal, the external device disables the command signal and considers the command signal not to be output.

In the above respective embodiments, the electrodes 21 to 24, 121, and the dummy electrodes 25, 125, 126, 127 configuring the respective electrostatic switches SW1 to SW4, SW are held by the same insulating sheet 20a. On the contrary, the dummy electrodes 25, 125, 126, and 127 may be held by another insulating sheet different from the insulating sheet 20a for holding the electrodes 21 to 24, and 121.

In the respective embodiments, when the electrostatic switch detects the contact operation when the operating state is detected by the detection portion, the output of the command signal is prohibited and disabled regardless of a start timing of the contact operation. On the contrary, when the start timing of the contact operation is earlier than a detection start timing of the operating state, the output of the command signal may be permitted.

In the embodiment illustrated in FIG. 1, the operation device according to the present disclosure is applied to the operation device mounted in the vehicle. However, the present disclosure is not limited to the vehicle-mounted operation device. In other words, if the operation device is equipped with the electrostatic switch and the manual operation portion, the present disclosure is applicable to the operation device mounted in something other than the vehicle.

What is claimed is:

1. An operation device comprising:
an operation plate having an operation surface;
a first electrode disposed at a position facing the operation surface;
a first determination portion configured to determine whether a hand of an operator touches the operation surface based on an amount of capacitance change between the hand of the operator and the first electrode;
an output portion configured to output a predetermined command signal when the first determination portion determines that the hand of the operator touches the operation surface;
a manual operation portion disposed on the operation plate and operated by the operator mechanically and manually;
a detection portion configured to detect that the hand of the operator is placed at a manually operable position where the manual operation portion is manually operable; and
a disablement portion configured to prohibit the output of the predetermined command signal from the output portion or disables the outputted predetermined command signal when the detection portion detects that the operator's hand is placed at the manually operable position, wherein
the detection portion includes:
a second electrode disposed at a position facing the manually operable position; and
a second determination portion configured to determine whether the hand of the operator is placed at the manually operable position based on an amount of capacitance change between the hand of the operator and the second electrode, and
the second electrode and the first electrode are supported by a same insulating sheet.

2. The operation device according to claim 1, wherein
the first determination portion determines that the hand of the operator touches the operation surface when the amount of capacitance change is larger than a first threshold,
the second determination portion determines that the hand of the operator is placed at the manually operable position when the amount of capacitance change is larger than a second threshold, and
the second threshold is smaller than the first threshold.

3. The operation device according to claim 1, being mounted on an instrument panel of a vehicle, wherein
the manual operation portion is a rotatable body rotationally operated by the operator, and
the second electrode is disposed in an area adjacent to an outer peripheral surface of a lower half of the rotating body.

4. An operation device, comprising:
an operation plate having an operation surface;
a first electrode disposed at a position facing the operation surface;
a manual operation portion disposed on the operation plate and operated by the operator mechanically and manually;
a detection portion configured to detect that the hand of the operator is placed at a manually operable position where the manual operation portion is manually operable; and a microcomputer, the microcomputer configured to include
- a first determination portion configured to determine whether a hand of an operator touches the operation surface based on an amount of capacitance change between the hand of the operator and the first electrode,
- an output portion configured to output a predetermined command signal when the first determination portion determines that the hand of the operator touches the operation surface, and
- a disablement portion configured to prohibit the output of the predetermined command signal from the output portion or disables the outputted predetermined command signal when the detection portion detects that the operator's hand is placed at the manually operable position; wherein the detection portion includes:
- a second electrode disposed at a position facing the manually operable position; and
- a second determination portion configured to determine whether the hand of the operator is placed at the manually operable position, based on an amount of capacitance change between the hand of the operator and the second electrode, and the second electrode and the first electrode are supported by a same insulating sheet.

* * * * *